United States Patent
Lakkapragada et al.

(10) Patent No.: US 7,626,861 B1
(45) Date of Patent: Dec. 1, 2009

(54) EMPLOYING UNUSED CONFIGURATION MEMORY CELLS AS SCRATCHPAD MEMORY

(75) Inventors: Shankar Lakkapragada, San Jose, CA (US); Jose M. Marquez, Mountain View, CA (US); Mark Men Bon Ng, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/343,417

(22) Filed: Dec. 23, 2008

Related U.S. Application Data

(62) Division of application No. 11/216,299, filed on Aug. 30, 2005, now Pat. No. 7,474,559.

(51) Int. Cl.
*G11C 16/20* (2006.01)
*H03K 19/177* (2006.01)

(52) U.S. Cl. .................... 365/185.08; 365/185.05; 326/44; 326/39

(58) Field of Classification Search ............ 365/185.05, 365/185.08; 326/38, 44, 39
See application file for complete search history.

(56) References Cited

U.S. PATENT DOCUMENTS

| | | | |
|---|---|---|---|
| 6,466,049 B1 | 10/2002 | Diba et al. | |
| 6,487,710 B1 | 11/2002 | Marquez | |
| 6,560,665 B1 | 5/2003 | Resler et al. | |
| 6,983,441 B2 * | 1/2006 | Wescott | 716/17 |
| 6,995,584 B1 | 2/2006 | Nguyen et al. | |
| 7,375,549 B1 * | 5/2008 | Tang et al. | 326/38 |
| 7,505,331 B1 * | 3/2009 | Camarota | 365/189.08 |
| 2001/0054129 A1 | 12/2001 | Wouters | |
| 2002/0184436 A1 | 12/2002 | Kim et al. | |

OTHER PUBLICATIONS

Xilinx, Inc., "XC9500XV Family High-Performance CPLD", Product Specification, DSO49, Apr. 15, 2005, (v2.2), pp. 1-18 available from Xilinx, Inc., 2100 Logic Drive, San Jose, CA 95124.

Xilinx, Inc., "XC9500XL High-Performance CPLD Family Data Sheet", Product Specification, DS054, Jul. 15, 2005, (v2.0), pp. 1-17, available from Xilinx, Inc., 2100 Logic Drive, San Jose, CA 95124.

Xilinx, Inc., "XC9500 In-System Programmable CPLD Family", Product Specification, DS063, Apr. 15, 2005, (v5.3), pp. 1-16, available from Xilinx, Inc., 2100 Logic Drive, San Jose, CA 95124.

(Continued)

*Primary Examiner*—Andrew Q Tran
(74) *Attorney, Agent, or Firm*—John J. King

(57) ABSTRACT

A method of employing memory cells of an integrated circuit is disclosed. The method comprises steps of storing configuration data in a plurality of memory cells of a memory of the integrated circuit; selecting unused memory cells of the memory of the integrated circuit for use as a scratchpad memory; providing access to the unused memory cells of the integrated circuit; and enabling use of the unused memory cell of the integrated circuit in a user mode as scratchpad memory. According to one embodiment of the invention, a plurality of input/output ports of the integrated circuit is coupled to a plurality of JTAG inputs coupled to the plurality of unused memory cells. A programmable logic device having memory cells for storing data, and a circuit employing a programmable logic device, are also disclosed.

11 Claims, 6 Drawing Sheets

OTHER PUBLICATIONS

Xilinx, Inc., "Virtex-II Platform FPGAs: Complete Data Sheet", Product Specification, DS031, Mar. 1, 2005, (v3.4), pp. 1-318, available from Xilinx, Inc., 2100 Logic Drive, San Jose, CA 95124.

Xilinx, Inc., "Spartan-3E FPGA Family: Complete Data Sheet", Product Specification, DS312, Mar. 21, 2005, (v1.1) pp. 1-193, available from Xilinx, Inc., 2100 Logic Drive, San Jose, CA 95124.

Xilinx, Inc., "CoolRunner-II CPLD Family", Product Specification, DS090, Jun. 28, 2005, (v2.5), pp. 1-14, available from Xilinx, Inc., 2100 Logic Drive, San Jose, CA 95124.

Xilinx, Inc., "CoolRunner XPLA3 CPLD", Product Specification, DS012, Apr. 8, 2005, (v2.1), pp. 1-12, available from Xilinx, Inc., 2100 Logic Drive, San Jose, CA 95124.

Rosch, Winn L., Hardware Bible, Mar. 2003, $6^{th}$ edition, Chapter 16, Section 3, 11 pages.

Khu, Arthur, et al., "Using Xilinx XCF02S/XCF04S JTAG PROMs for Data Storage Applications", XAPP544 (v1.0) Jul. 20, 2005, pp. 1-6, Xilinx, Inc., 2100 Logic Drive, San Jose, CA 95124.

Altera Corporation; "Serial Configuration Devices Advanced Features", 2 pages, available from Altera Corporation, 101 Innovation Drive, San Jose, California 95134, USA or at http://altera.com/products/devices/serialcfg/features/scu-adv_features.html.

U.S. Appl. No. 11/216,299, filed Aug. 5, 2005, Lakkapragada, Shankar et al., Xilinx, Inc., 2100 Logic Drive, San Jose, CA 95124.

U.S. Appl. No. 11/169,462, filed Jun. 29, 2005, Khu, Arthur H., Xilinx, Inc., 2100 Logic Drive, San Jose, CA 95124.

* cited by examiner

EMPLOYING UNUSED CONFIGURATION MEMORY CELLS AS SCRATCHPAD MEMORY

FIELD OF THE INVENTION

The present application is related to integrated circuits, and more particularly, to a method of and circuit for employing memory cells of an integrated circuit having programmable logic.

BACKGROUND OF THE INVENTION

A programmable logic device (PLD) is an integrated circuit (IC) that is designed to be user-programmable so that users may implement logic designs of their choices. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory or SRAM cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g., a programmable ROM (PROM), an erasable PROM (EPROM), an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. At the end of this start-up phase, the PLD is now specialized to the user's design, and the PLD enters into "user" mode as part of its normal operation. Once in "user" mode, some resources of the PLD such as logic blocks, routing resources, block RAMs, distributed RAM and I/O pins are made available to the user.

However, the internal configuration memory cells of conventional devices having programmable logic are not made available to end-users. That is, conventional devices do not provide direct access to these internal configuration memory cells of the device during a user mode. In some applications where a programmable logic device has no user-available RAM, a separate memory chip is used for scratchpad memory, which is a temporary memory for storing data generated during a user mode of operation. For example, while FPGAs typically have on-chip block RAM or distributed RAM, conventional CPLDs typically do not have these resources, and circuit designers instead rely on RAM external to the CPLD.

Further, circuits implemented by different customers using PLDs are usually unique. Because PLDs are not design specific and may be used with any design, the configuration memory which is loaded with configuration data will vary based upon the user's circuit design. Therefore, even if a user knows that a given circuit design will not use all of the available memory, and particularly configuration memory, there is no way of telling which configuration memory elements will not be used or will only be partially used before a circuit design is implemented in a PLD.

Accordingly, there is a need for a circuit for and method of employing memory cells of a programmable logic device which make greater use of unused memory cells.

SUMMARY OF THE INVENTION

A method of employing memory cells of an integrated circuit is disclosed. The method comprises steps of storing data in a plurality of memory cells of a configuration memory of the integrated circuit; selecting unused memory cells of the configuration memory for use as a scratchpad memory; providing access to the unused memory cells of the configuration memory; and enabling use of the unused memory cells of the configuration memory in a user mode as scratchpad memory. According to one embodiment of the invention, a plurality of input/output ports of the integrated circuit is coupled to a plurality of test ports coupled to the configuration memory to enable use of the unused memory cells.

An integrated circuit is also disclosed. The integrated circuit comprises a plurality of configurable logic blocks, wherein each configurable logic block comprises a configuration memory for storing configuration data. An input/output port is provided for receiving the configuration data to be stored in a first portion of the plurality of memory cells of a configurable logic block. Finally, an unused portion of the plurality of memory cells of a configurable logic block is used as scratchpad memory for storing temporary data. The unused portion of memory cells may comprise memory cells of a random access memory or a read only memory.

Finally, a circuit employing an integrated circuit having memory is also disclosed. The circuit comprises a programmable logic device having a configuration memory comprising a plurality of memory cells for storing configuration data; and an external circuit coupled to the programmable logic device. The external circuit couples data to be stored in unused memory cells of a configuration memory. The external circuit may be, for example, a separate integrated circuit or device on a circuit board, where access to the configuration memory of the programmable logic device eliminates the need for a separate memory device on the circuit board.

DETAILED DESCRIPTION OF THE DRAWINGS

Figure 1:
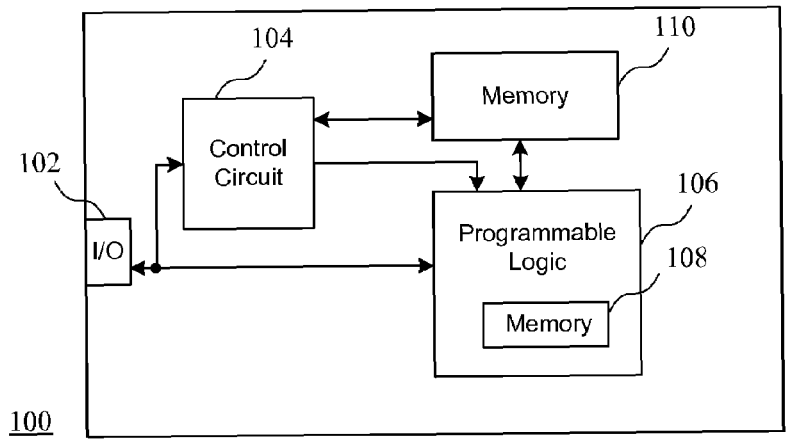
FIG. 1 is a block diagram of a circuit for employing memory according to an embodiment of the present invention.

Turning first to FIG. 1, a block diagram of a circuit for employing memory according to an embodiment of the present invention is shown. The circuit of FIG. 1 preferably comprises an integrated circuit 100 having an input/output port 102 coupled to a control circuit 104 and a programmable logic circuit 106. The programmable logic circuit comprises programmable logic or resources such as gates which are configurable by a user of the circuit to implement a circuit design of the user. The circuits implemented in the programmable logic circuit are implemented according to configuration data downloaded to the integrated circuit 100. As will be described in more detail below, the programmable logic circuit comprises configuration memory 108. Generally, configuration memory 108 comprises memory cells for configuring the programmable resources based upon the configuration data. Although a single programmable logic circuit 106 is shown, it should be understood that the programmable logic circuit 106 may comprise a plurality of programmable logic circuits. Similarly, although a single configuration memory 108 is shown, a given programmable logic circuit may comprise a plurality of memory blocks having memory cells. Also, configuration memory 108 may be either volatile memory or non-volatile memory, or a programmable logic circuit may include both volatile and non-volatile memory, as will be described in more detail below. Finally, the circuit may comprise a memory 110, external to the programmable logic circuit, which may either be volatile or non-volatile memory. In some embodiments, memories 108 and 110 may be combined, and part or all of both memories may be external to integrated circuit 100. Also note that although configuration memory 108 and memory 110 are illustratively shown as discrete blocks, in some embodiments, they may be dispersed throughout integrated circuit 100.

The circuit of FIG. 1 may be any device having programmable logic, such as a programmable logic device described above, or any integrated circuit having programmable logic, such as an application-specific integrated circuit (ASIC) having a portion of circuits which are programmable. In embodiments including a programmable logic device, the PLD may be any PLD such as an FPGA, a CPLD, or a non-volatile FPGA (NVFPGA, i.e., an FPGA where at least a portion of the configuration memory is non-volatile). As will be described in more detail below in reference to specific programmable logic devices, the circuit of FIG. 1 enables utilization of the unused configuration memory cells as temporary memory, commonly referred to as scratchpad memory, required when the device is in a user mode (i.e., when the integrated circuit is operating according to the circuit implemented in the programmable logic). For example, a temporary or scratchpad memory may be required to store a temporary value calculated during the operation of a circuit of an end-user in the "user" mode. Further, according to other aspects of the circuits for employing memory cells, the memory cells may be accessible via configuration of test ports, such as test ports of the IEEE Standard 1149.1 Test Access Port and Boundary Scan Architecture, commonly referred to as Joint Test Action Group (JTAG) test ports. "Unused" configuration memory cells may include those memory cells not being used for configuration in unused blocks of memory or partially used blocks of memory. These unused configuration memory cells may complement any user-available blocks of memory internal or external to the integrated circuit which are available to a user in conventional devices, thereby expanding the amount of memory available to a user for use as temporary memory. Accordingly, the various embodiments of the present invention enable the efficient use of internal memory cells of an integrated circuit, such as a programmable logic device, and in certain cases eliminate the need for memory external to a programmable logic device.

Figure 2:
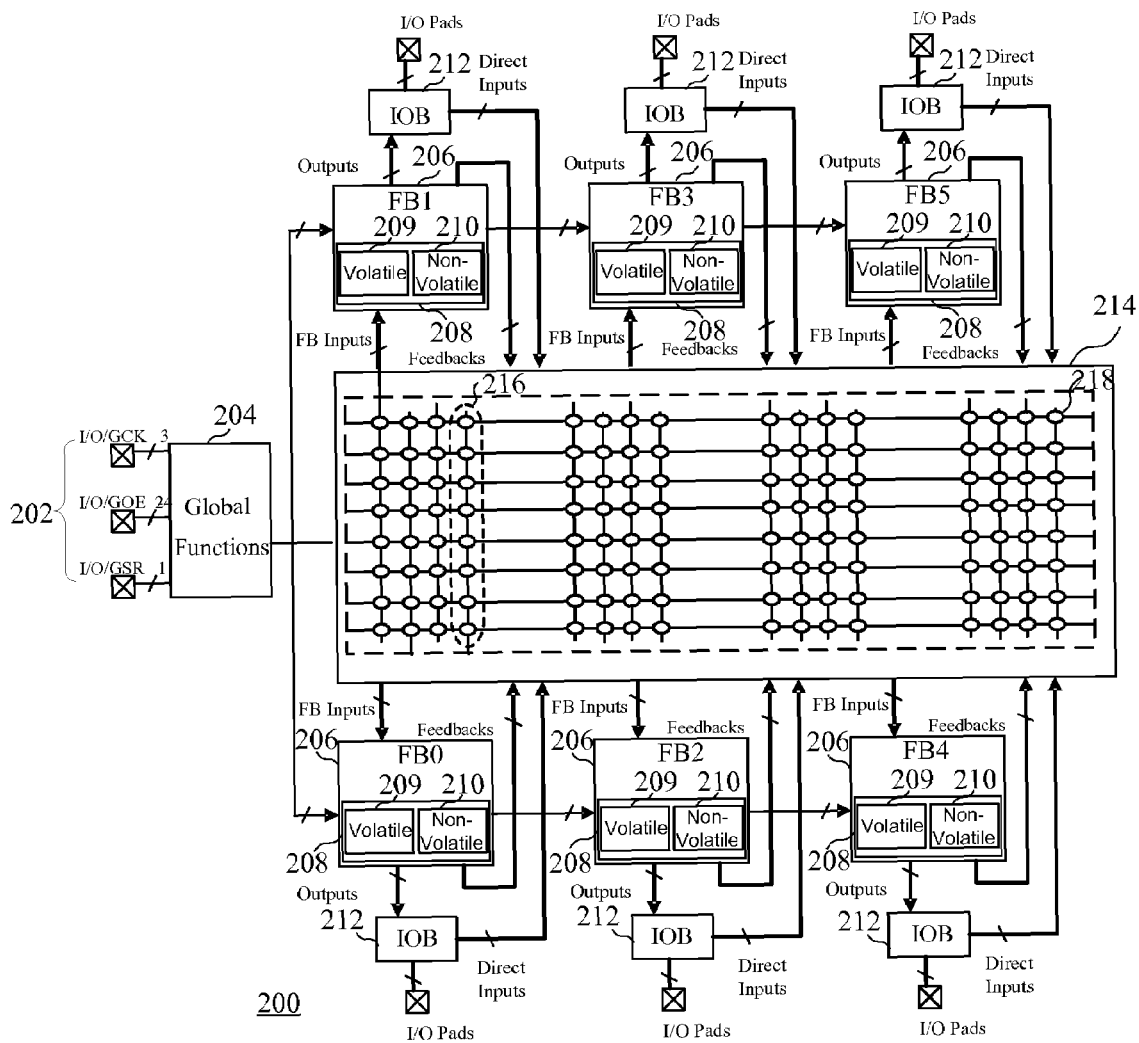
FIG. 2 is a block diagram of a complex programmable logic device according to an embodiment of the present invention.

Turning now to FIG. 2, a simplified illustration of an exemplary CPLD 200 enabling efficient use of configuration memory cells according to an embodiment of the present invention is shown. The CPLD comprises a plurality of input/output pads 202 coupled to a global functions block 204, which may provide clock signals to the remaining portions of the CPLD and enable routing of data to and from the internal circuits of the CPLD. The CPLD further comprises a plurality of function blocks 206 (FB0 through FB5), which comprise blocks of programmable logic. Each function block of the CPLD typically includes a two-level AND/OR structure similar to those used in Programmable Logic Arrays (PLAs) and Programmable Array Logic (PAL) devices, as is well known in the art. Each of the function blocks preferably comprises configuration memory 208, which may comprise volatile memory 209 and/or non-volatile memory 210. Function blocks which are unused will therefore comprise configuration memory which is unused. While the configuration memory of unused functions blocks provide sources of available memory which may be employed as a scratchpad memory, memory cells of memories which are partially used may also be used as scratchpad memory, as will be described in more detail in reference to FIG. 3 below.

The function blocks are connected together and to input/output blocks 212 by a programmable interconnection array 214. The programmable interconnection array includes many multiplexer circuits 216, each including several Programmable Interconnection Points (PIPs) 218. In each multiplexer circuit 216, typically only one PIP 218 is enabled. The enabled PIP selects one of the many input signals provided to the interconnection array, and the selected input signal is provided as the output signal from the multiplexer circuit 216. Further information on CPLDs may be found, for example, in U.S. Pat. No. 6,466,049 B1 by Sholeh Diba et al., issued Oct. 15, 2002, which is hereby incorporated herein by reference.

Figure 3:
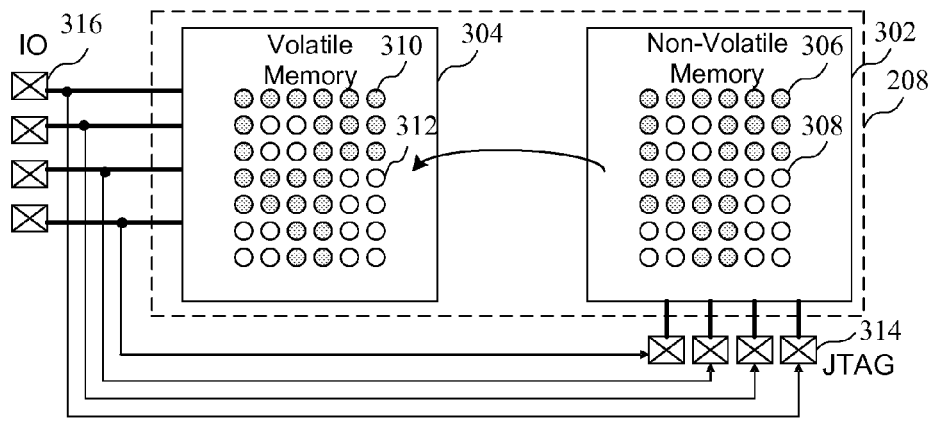
FIG. 3 is a block diagram of memory elements of the complex programmable logic device of FIG. 2 according to an embodiment of the present invention.

Turning now to FIG. 3, a block diagram of memory elements of the complex programmable logic device of FIG. 2 according to an embodiment of the present invention is shown. The configuration memory 208 as shown in FIG. 3 comprises an internal non-volatile memory 302 (such as a PROM, EPROM or EEPROM containing configuration data in its memory cells) and an internal volatile memory 304 (such as an SRAM which receives the configuration data from the non-volatile memory to properly configure the latches of the functional block). As can be seen in FIG. 3, certain cells of the non-volatile memory comprise used cells 306 (i.e., cells having valid configuration data) shown as shaded circles, while the remaining cells comprise unused cells 308. During device startup or initialization, the contents of the non-volatile memory 302 are successively transferred to the cells of the volatile memory 304, causing the function block to be specialized according to the user's design. After the transfer, some cells of the volatile memory comprise used cells 310, also shown as shaded circles, while the remaining cells are unused cells 312. According to one aspect of the invention, the unused cells may be designated as scratchpad memory. That is, after the device is initialized in a "startup" mode, and during normal "user" mode, unused non-volatile memory cells (e.g., unused cells 308) and unused volatile memory cells (e.g., unused cells 312) of any of the function blocks are made available for reading or writing data. Preferably, the data may be deleted from the non-volatile memory after the transfer to the volatile memory, in which case the entire non-volatile memory would become unused and available as scratchpad memory during the user mode. Although the user of the device would lose the design in the event of a loss of power if data is deleted from the non-volatile memory, the user may reload the configuration data using on-the-fly (OTF) programming, for example. However, the non-volatile memory 302 may also retain the data after the transfer to the volatile memory, as shown in FIG. 3. A control circuit keeps track of, and makes available, all unused configuration memory even in partially used memories of function blocks, as shown in FIG. 3, for use as scratchpad memory. Because JTAG ports 314 are coupled to the I/O ports 316 of the integrated circuit, the unused cells of the memory 208 are accessible by the devices external to the integrated circuit 100. Alternatively, the unused memory cells are accessible internally to the integrated circuit by way of the JTAG ports 314.

To program an integrated circuit having programmable logic, designers use PROM programmers or program by way of the Test Access Port (TAP) of the JTAG ports. The TAP comprises four dedicated pins including: the TMS pin (for tracking the controller state), the TCK pin (for receiving the JTAG test clock), the TDI pin (for receiving serial data) and the TDO pin (for outputting serial data) to support all mandatory JTAG instructions. The device also extends the JTAG architecture to implement many of the optional instructions for in-system programming (ISP) as will be described below. These extensions allow cell programming, erasure and verification. As can be seen in FIG. 3, the four I/O pins of the integrated circuit are coupled to the four JTAG pins for easy access to these internal memory areas by an external device as will be described in more detail in reference to FIG. 6. Alternatively, internal logic may be used to drive the JTAG pins according to the embodiment of FIG. 3. The arrangement of FIG. 3 also enables access to the unused memory cells either serially or in a parallel manner, based upon an address supplied by the user, as will be described in more detail below.

According to one aspect of the invention, read and write operations may be performed by way of the JTAG ports. At some stage in the running of the circuit implemented in programmable logic, a write operation may need to be performed at a given address (e.g., for RAMs) to store data in scratchpad memory. The device is placed in the appropriate ISP mode for writing, and uses the data on the data and address pins to write to memory. When the writing is finished, a JTAG instruction is issued to return the device to the user mode. At another stage in the running of the circuit, a read operation may need to be performed at an address. Once again, the device is placed in the appropriate ISP mode for reading, and uses the address pins to read from the memory. Upon completion, the data is made available to the data pins and a JTAG instruction is issued to return the device to the user mode. The JTAG control signals may be generated externally to the integrated circuit if an external device is using configuration memory cells of the integrated circuit as scratchpad memory. Alternatively, the JTAG signals may be generated internal to the integrated circuit to enable reading from or writing to unused configuration memory cells.

In order to perform a serial write operation of specified data to a specified address, the appropriate JTAG instructions are shifted in to the TDI pin to enable the ISP serial programming mode. The appropriate JTAG instructions are then shifted in to program the configuration memory. All address bits are provided to the pins designated for addressing. Data is then shifted in to program the device, and the ISP mode is exited. Similarly, in order to perform a serial read operation from a specified address, the appropriate JTAG instructions are shifted in to the TDI pin to enable the ISP serial programming mode. The appropriate JTAG instructions are shifted in to read from the configuration memory. All address bits are provided to the pins designated for addressing, and data is serially read from the TDO pin before the ISP mode is exited.

Similarly, it is possible to perform parallel read and write operations by way of the JTAG ports. In order to perform a parallel write operation of specified data to a specified address, the appropriate JTAG instructions are shifted in to the TDI pin to enable ISP parallel programming mode. All address bits are provided to the pins designated for addressing. Data is supplied at the appropriate data pins, and the necessary strobe signals are supplied to write the data to the specified address. The ISP mode is then exited. Similarly, a parallel read operation from a specified address may also be performed by shifting in the appropriate JTAG instructions to the TDI pin to enable ISP parallel programming mode. All address bits are provided to the pins designated for addressing. The necessary strobe signals are supplied to read data from the specified address. Finally, parallel data is read at the appropriate data pins, and the ISP mode is exited.

Figure 4:
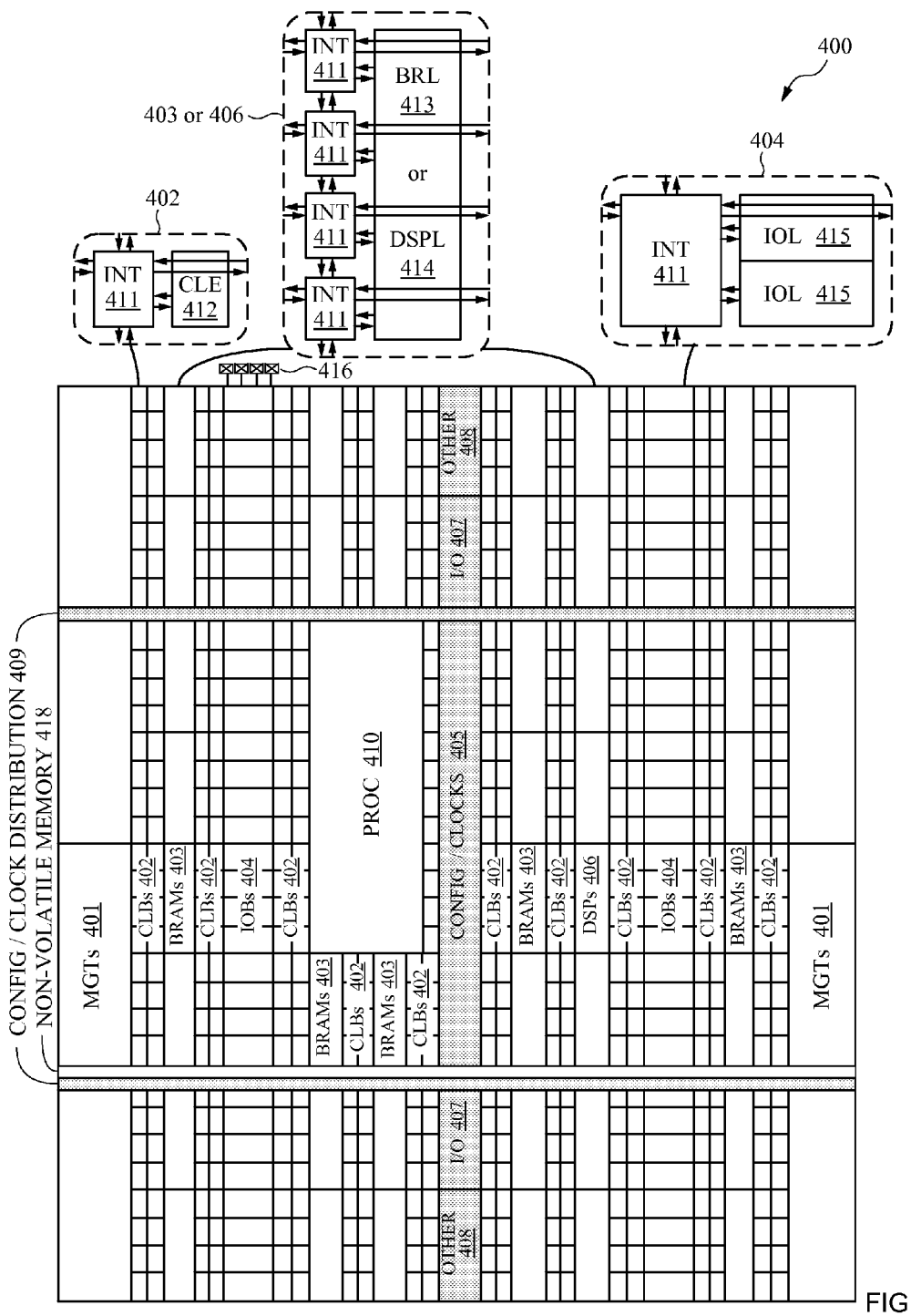
FIG. 4 is a block diagram of a field programmable gate array according to an embodiment of the present invention.

Turning now to FIG. 4, a block diagram of a circuit for enabling the efficient use of memory cells according to an embodiment of the present invention is shown. In particular, advanced FPGAs may include several different types of programmable logic blocks in the array. For example, FIG. 4 illustrates an FPGA architecture 400 that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include one or more dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 may include a configurable logic element (CLE 412) that may be programmed to implement user logic plus a single programmable interconnect element (INT 411). A BRAM 403 may include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 406 may include a DSP logic element (DSPL 414) in addition to an appropriate number of programmable interconnect elements. An IOB 404 may include, for example, two instances of an input/output logic element (IOL 415) in addition to one instance of the programmable interconnect element (INT 411). As will be clear to those of skill in the art, the actual I/O pads 416 connected, for example, to the I/O logic element 415 are manufactured using metal layered above the various illustrated logic blocks, and typically are not confined to the area of the input/output logic element 415. Similar to the circuit of FIG. 3, the I/O pads 416 are coupled to JTAG ports associated with the configurable logic block, enabling an external device to use unused configuration memory cells of the configuration logic blocks or other programmable tiles as scratchpad memory, in addition to other available memory such as the BRAMs 403. However, it should be understood that internal logic of the FPGA (e.g., logic implemented in one of the CLBs) may also be coupled to the JTAG pins of the configuration logic block to enable the use of unused configuration memory cells as scratchpad memory.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA. Some FPGAs utilizing the architecture illustrated in FIG. 4 include additional logic blocks that disrupt the regular columnar structure making up a large part of the FPGA. The additional logic blocks may be programmable blocks and/or dedicated logic. For example, the processor block PROC 410 shown in FIG. 4 spans several columns of CLBs and BRAMs. Finally, a non-volatile memory 418 may be employed for on-chip storage of configuration data which is used to configure the configuration logic blocks or other programmable tiles as described above.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 5:
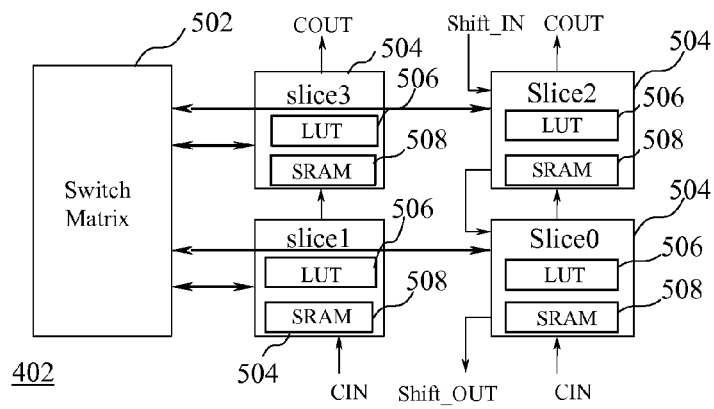
FIG. 5 is a block diagram of a configurable logic block of the field programmable gate array of FIG. 4 according to an embodiment of the present invention.

Turning now to FIG. 5, a block diagram of a configurable logic block 402 of the field programmable gate array of FIG. 4 according to an embodiment of the present invention is shown. The configurable logic block comprises a switch matrix 502 coupled to a plurality of smaller blocks 504, called slices. Each block 504 comprises two function generators 506 and 508, shown here implemented as a look-up table and an SRAM. The function generators are programmable by data in configuration memory cells and may be configured to implement one of a variety of functions, such as a four input lookup table, 16 bits of distributed RAM memory, or a 16-bit variable-tap shift register element, for example. The control circuit may implement the function generators of all unused blocks 504 as SRAM. Alternatively, the control circuit may configure the function generators according to the temporary memory needs of the user. It is also contemplated that empty memory cells of used function blocks 506 or 508 implemented as SRAM may be used as a temporary memory as will be described in more detail in reference to FIG. 6. While the look-up table memory provides faster access to the data compared to an SRAM, the function generator 506 must be implemented as a look-up table. Therefore, fewer memory elements of block 504 configured as a look-up table are available for scratchpad memory. However, the increased access speed of the look-up table may be more important in the circuit design than the scratchpad memory capacity.

Because there are a number of different types of unused memory cells of the various programmable logic devices described above, the control circuit will also preferably make available unused memory according to a predetermined order. For example, if there is available volatile memory on the integrated circuit external to the configurable logic, the unused memory elements of the volatile memory, such as the BRAMs 403, should be used first before unused memory cells of the configurable logic blocks. The unused memory cells of a configurable logic block may then be used. A hierarchy for allocating unused memory cells of a configurable logic block for scratchpad memory may be employed. For example, configuration memory cells may be used first. Then, if additional memory cells are required, memory implemented by a function generator of an unused configurable logic block would be used first before using unused memory cells of memory implemented by a function generator of a used configurable logic block. For unused memory implemented in a configuration logic block, a lookup table (LUT) memory of a block 504, such as function generator 506 implemented as a look-up table, would preferably be used first, followed by an SRAM. Generally, flash memory or EEPROM memory may be used last. According to the hierarchy described above, memory cells are grouped according to their access speeds, for example from fastest to slowest. Other factors such as bandwidth or proximity may also be used in determining a hierarchy of memory cells. However, if scratchpad memory capacity is a concern, all of the function generators of the blocks 504 may be implemented as SRAMs.

Figure 6:
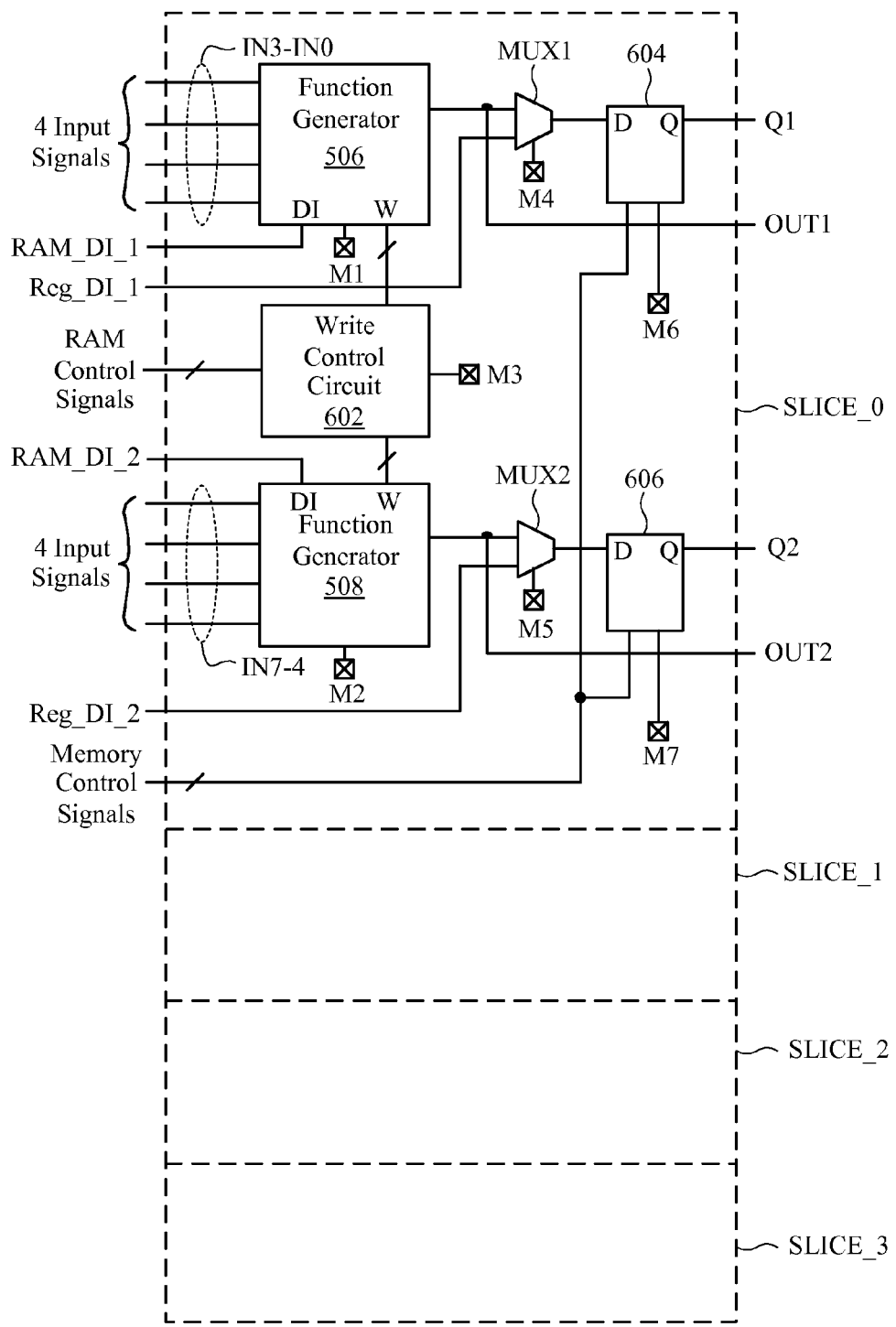
FIG. 6 is a block diagram of a configurable logic element 412 of the configuration logic block of FIG. 4 according to an embodiment of the present invention.

Turning now to FIG. 6, a block diagram of a configurable logic element 412 according to an embodiment of the present invention is shown. In particular, FIG. 6 illustrates in simplified form a configurable logic element of a configuration logic block of FIG. 4 comprising four similar slices (SLICE_0-SLICE_3). Each slice includes two functions generators 506 and 508, a write control circuit 602, two multiplexers MUX1 and MUX2, and two output memory elements 604 and 606. The function generators, write control circuit, multiplexers, and output memory elements are all controlled by configuration memory elements M1-M7 which may be single or multiple cell memory elements. For example, a single configuration bit may be necessary to initialize the output control element 604. In contrast, memory element M1 may require two bits to select the implementation of the function generation (e.g., one of the three implementations described above). In the case of multi-cell memory elements, a memory disable signal may be used to avoid contention as will be described in more detail in reference to FIG. 8. While memory elements M1-M7 are shown by way of example, other memory elements may also be included.

Figure 7:
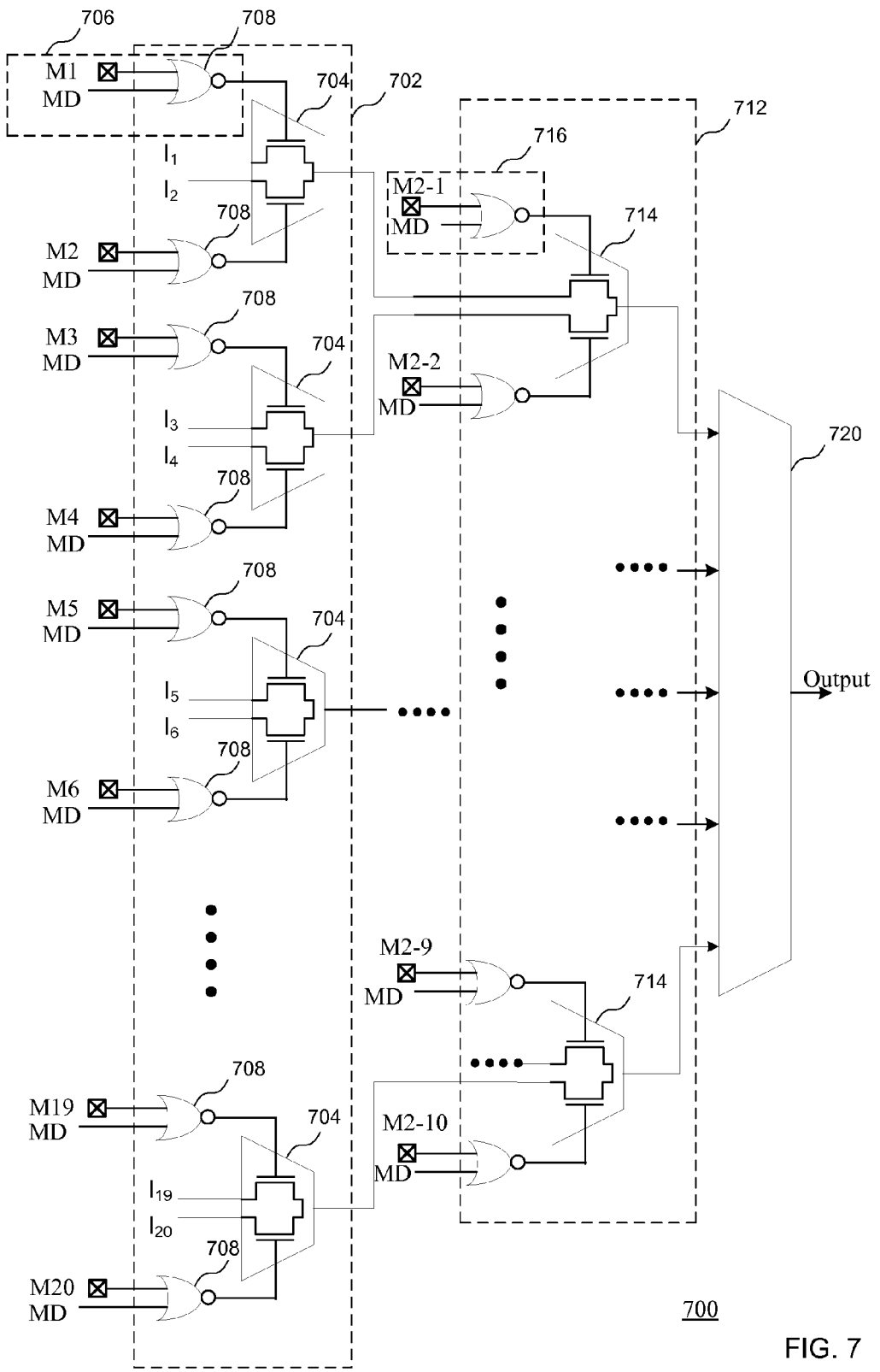
FIG. 7 is a block diagram of an input multiplexer of the programmable interconnect element 411 of FIG. 4 according to an embodiment of the present invention.

Further, in addition to using configuration memory of an FPGA, such as memory elements M1-M7, for scratchpad memory as shown, logic that is part of the programmable logic and is implemented as memory (such as a function generator implemented as an SRAM or a lookup table memory as described above) may also be used as scratchpad memory. Each function generator may function in any of several modes depending upon the data in the configuration memory elements. When in lookup table mode, each LUT has four data input signals IN3-IN0 that are supplied by the programmable interconnect element 411 via input multiplexers, which will be described in more detail in reference to FIG. 7. When in RAM mode, input data is supplied by an input terminal RAM_DI_1, RAM_DI_2 to the data input (DI) terminal of the associated function generator. RAM write operations in both function generators are controlled by write control circuit 602, which supplies one or more write control signals W to both function generators based on RAM control signals provided by the programmable interconnect element. Each function generator provides an output signal to an associated multiplexer MUX1, MUX2, which selects between the output signal function generator and an associated register direct input signal Reg_DI_1, Reg_DI_2 from the programmable interconnect element. Thus, each function generator may be optionally bypassed. The output of each multiplexer MUX1, MUX2 is provided to the data input terminal D of an associated output memory element. Each memory element 604 and 606 provides a registered output signal Q1, Q2. The output of each function generator 506 and 508 is also provided to an output terminal OUT1, OUT2. Thus, each output memory element may be optionally bypassed. However, when a function generator is implemented as a look-up table or SRAM, the configuration memory cells used to configure the function generator are not available to be used as scratchpad memory. Turning now to FIG. 7, a block diagram of an input multiplexer of programmable interconnect element 411 of FIG. 4 according to an embodiment of the present invention is shown. In particular, the input multiplexer 700 comprises a 20-1 multiplexer having a first stage 702 comprising a plurality of multiplexers 704, each having two pass gate transistors coupled to receive two inputs of the twenty inputs $I_1$-$I_{20}$. However, as can be seen, if two memory elements are used to select the output of the multiplexer 704, there may be a contention issue when one of the memory cells of a pair of memory cells coupled to the same multiplexer is used for scratchpad memory. For example, if only inputs $I_1$-$I_{19}$ are required, the memory element used to select input $I_{20}$ would be available for use as scratchpad memory. However, if input $I_{19}$ were selected and is a low signal, there would be a contention issue if the memory element M20 used as scratchpad memory is high. Therefore, rather than a conventional arrangement with a memory element coupled directly to a gate of the pass gate transistors, the input multiplexer employs a selection block 706 to avoid contention. The selection block 706 comprises a NOR gate 708 coupled to receive the bit stored in the memory element at a first input and a memory disable (MD) signal at a second input. If the memory element is being used as a scratchpad memory, the memory disable signal is high, generating a low output at the output of the NOR gate 708 to avoid contention in the multiplexer 704. The circuit of FIG. 7 also includes a second stage 712 having a plurality of multiplexers 714 also coupled to selection blocks 716, and an output multiplexer 720 to generate an output. While the circuit of FIG. 7 provides one example of an input multiplexer, other input multiplexers may be employed. Similarly, the selection blocks may be employed in other circuits, including an output multiplexer, for example, or any other circumstance where it is necessary to isolate the memory when it is used as a scratchpad memory.

Figure 8:
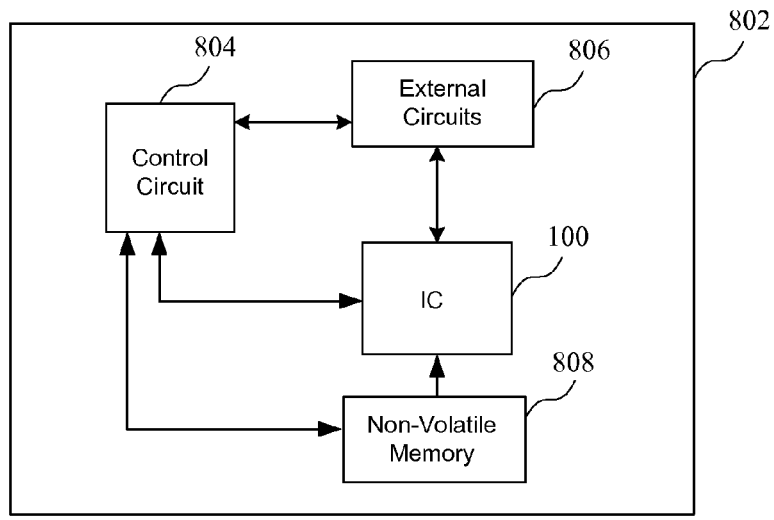
FIG. 8 is a block diagram of circuit employing an integrated circuit according to an embodiment of the present invention.

Turning now to FIG. 8, a block diagram of circuit employing an integrated circuit 100 according to an embodiment of the present invention is shown. The circuit comprises a circuit board 802 having a control circuit 804. The control circuit 804 may be, for example, a microprocessor or other integrated circuit for controlling external circuits 806, integrated circuit 100, and a non-volatile memory 808. Depending upon the type of device employing programmable logic which is used, the control circuit 804 may be implemented on the programmable logic device (e.g., IC 100). By allowing users to employ unused configuration memory cells of the integrated circuit 100 as described above, board-level devices, such as external circuits 806, external to the integrated circuit 100 may access the unused memory cells of the integrated circuit. Therefore, the circuit arrangement of FIG. 6 provides users with a single chip solution having the required scratchpad memory and therefore saving on overall cost and board space. For applications using programmable logic devices with user-available RAM, access to unused memory cells expands the total available memory.

Figure 9:
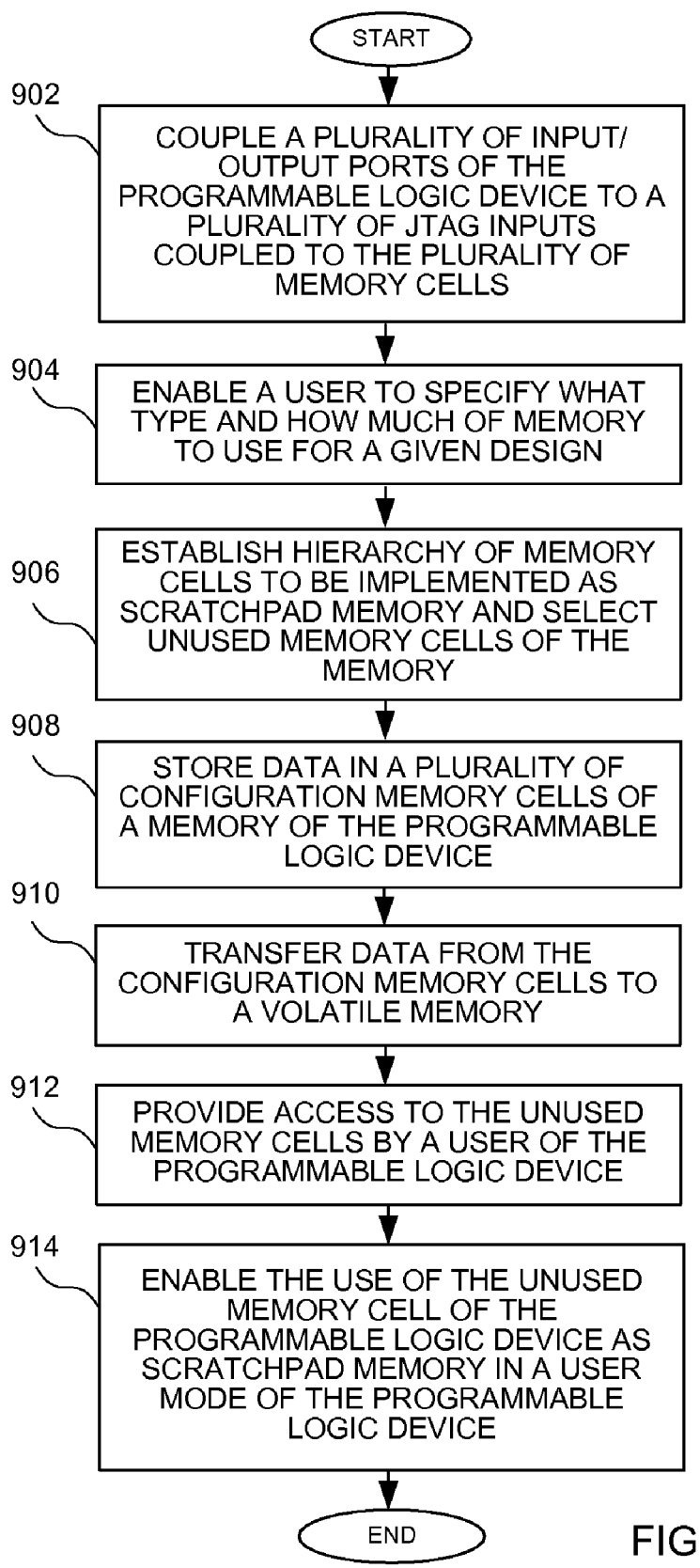
FIG. 9 is a flow chart showing a method of employing memory cells of a configurable logic block according to an embodiment of the present invention.

Finally, turning to FIG. 9, a flow chart shows a method of employing memory cells of an integrated circuit having programmable logic according to an embodiment of the present invention. In particular, a plurality of input/output ports of a programmable logic device is coupled to a plurality of JTAG inputs of a configuration memory at a step 902. A user may also be able to specify what type and how much memory to use for a given design when implemented in a programmable logic circuit at a step 904. For example, the user may specify that a certain amount of memory is needed for configuration logic and a certain amount of memory is needed for scratchpad memory. A hierarchy of memory cells to be implemented as scratchpad memory is established, and unused memory cells of the configuration memory are selected to be used as scratchpad memory at a step 906. The hierarchy may be based upon predetermined criteria, such as whether a memory is unused or partly used and an access speed for a memory. Configuration data is stored in a plurality of memory cells of a configuration memory for the programmable logic device at a step 908. Configuration data is transferred from the non-volatile configuration memory to a volatile configuration memory at a step 910. The configuration data may either be transferred from non-volatile memory external to the programmable logic device, non-volatile memory on the programmable logic device, or in some cases non-volatile memory which is associated with the programmable logic circuit. In the case where data is transferred from non-volatile memory associated with the programmable logic circuit, as shown in FIG. 3 for example, the unused configuration memory cells may be cells of both volatile memory and non-volatile memory. Access is provided to the unused memory cells, including volatile and non-volatile memory, in a user mode of the programmable logic device at a step 912. The use of the unused memory cell of the programmable logic device as scratchpad memory in a user mode of the programmable logic device is enabled at a step 914. The use may be enabled for example by internal or external programming through test ports, such as JTAG test ports.

According to a typical user software design flow employing the circuits and methods described above, the user instantiates memory (RAM32×2, ROM64×1, etc.) primitives in a design along with other design logic. The user may specify constraints to assign the logic to specific memory addresses, either scratchpad or user RAM. Finally, based on constraints, logic requirements and memory requirements, a software program enabling unused configuration memory to be used as scratchpad memory partitions the design into the appropriate areas. In some cases it may be desirable to use unused configuration memory, rather than block RAM external to the configuration logic block, as scratchpad memory. Once finished, the software creates a report file. Accordingly, software may aid the user to exploit these newly available memory by transparently deciding which memory areas (user RAM blocks or internal scratchpad memory) should be used for parts of the design; providing mechanisms (i.e., constraints) which let users specify that parts of the design should reside in scratchpad memory or user RAM blocks; and preventing use of configuration areas as scratchpad memory which are already being used by the programmable logic device via design rule checks (e.g., provide reports enumerating what configuration memory resources may be set aside as scratchpad memory).

The methods and circuits for employing memory cells of a programmable logic device described above have a number of advantages. For example, the methods and circuits provide cost efficiency. That is, the circuits described above may replace one or more memory devices otherwise required on a circuit board with a programmable logic device having reconfigured on-chip memory to potentially provide a one-chip solution. By reducing memory chips on a circuit board or system, users may reduce cost and may save on-board real estate. Because for some designs, the configuration memory area of the programmable logic device may not always be fully utilized, the circuits and methods of employing unused memory cells of configuration memory thus makes more efficient use of the available memory space of a programmable logic device. Devices employing the circuits and methods of the present invention are easy to use because software may be used to intelligently and transparently partition the internal configuration areas into configuration logic and user-available memory. Users need only to specify how much and what type(s) of memory they need during their design process. The circuits and methods also provide logic and resource efficiency. In some applications, it may be more desirable to use available on-chip configuration memory rather than logic block resources.

It may therefore be appreciated that the new and novel circuit for and method of employing a memory in a configurable logic block has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit comprising:
   a programmable block comprising a configuration memory for storing configuration data;
   an input/output port, coupled to said programmable block, for receiving configuration data to be stored in a first portion of said configuration memory of said programmable block; and
   an unused portion of said configuration memory of said programmable block comprising a scratchpad memory for storing temporary data.

2. The integrated circuit of claim 1 wherein said configuration memory having said unused portion is separate from said configuration memory having said first portion storing said configuration data.

3. The integrated circuit of claim 1 further comprising a test port of said configuration memory that is coupled to said input/output port of said integrated circuit.

4. The integrated circuit of claim 1 wherein said unused portion of said configuration memory comprises memory cells of a volatile memory.

5. The integrated circuit of claim 1 wherein said unused portion of said configuration memory comprises memory cells of a non-volatile memory.

6. The integrated circuit of claim 1 wherein said programmable block is a configurable logic block.

7. The integrated circuit of claim 6 further comprising logic elements of said configurable logic block configured as memory implemented as scratchpad memory.

8. The integrated circuit of claim 7 wherein each of said logic elements of said configurable logic block comprises a look-up table.

9. A circuit employing the integrated circuit of claim 1 wherein the circuit includes an external circuit coupled to said integrated circuit, said external circuit includes data to be stored in said unused portion of said configuration memory.

10. A circuit employing the integrated circuit of claim 1 wherein the circuit includes an external memory coupled to said integrated circuit.

11. A circuit employing the integrated circuit of claim 1 wherein the circuit includes a control circuit coupled to said integrated circuit, said control circuit controls said integrated circuit.

* * * * *